(12) United States Patent
Huot-Marchand et al.

(10) Patent No.: US 9,731,697 B2
(45) Date of Patent: Aug. 15, 2017

(54) HOMOGENEITY DETECTION CIRCUIT, A VALVE DRIVING SYSTEM AND A METHOD OF HOMOGENEITY DETECTION IN A VALVE DRIVING SYSTEM

(71) Applicants: Alexis Huot-Marchand, Fonsorbes (FR); Christelle Franchini, Fontenilles (FR)

(72) Inventors: Alexis Huot-Marchand, Fonsorbes (FR); Christelle Franchini, Fontenilles (FR)

(73) Assignee: NXP USA, Inc., Austin, TX (US)

( * ) Notice: Subject to any disclaimer, the term of this patent is extended or adjusted under 35 U.S.C. 154(b) by 173 days.

(21) Appl. No.: 14/655,213

(22) PCT Filed: Jan. 9, 2013

(86) PCT No.: PCT/IB2013/000103
§ 371 (c)(1),
(2) Date: Jun. 24, 2015

(87) PCT Pub. No.: WO2014/108714
PCT Pub. Date: Jul. 17, 2014

(65) Prior Publication Data
US 2015/0336556 A1    Nov. 26, 2015

(51) Int. Cl.
G01R 31/00 (2006.01)
B60T 17/22 (2006.01)
G01R 31/04 (2006.01)
B60T 15/02 (2006.01)
B60T 8/36 (2006.01)

(52) U.S. Cl.
CPC .............. *B60T 17/221* (2013.01); *B60T 8/36* (2013.01); *B60T 15/025* (2013.01); *G01R 31/005* (2013.01); *G01R 31/041* (2013.01); *B60T 2270/406* (2013.01)

(58) Field of Classification Search
USPC .......................................... 324/503
See application file for complete search history.

(56) References Cited

U.S. PATENT DOCUMENTS

| 3,482,234 A | * | 12/1969 | Doniger | ................... | H03K 5/24 246/169 D |
| 3,912,340 A | | 10/1975 | Bertolasi | | |
| 3,981,545 A | | 9/1976 | Eddy | | |

(Continued)

OTHER PUBLICATIONS

International Search Report and Written Opinion correlating to PCT/IB2013/000103 issued on Sep. 25, 2013.

*Primary Examiner* — Patrick Assouad
*Assistant Examiner* — Demetrius Pretlow

(57) ABSTRACT

A homogeneity detection circuit, a valve driving system, a vehicle, an integrated circuit and a method of homogeneity detection in a valve driving system are provided. The homogeneity detection circuit comprises a first input, a second input and a comparison circuit. The first input receives a first signal being related to a first driving signal for driving a first valve. The second input receives a second signal being related to a second driving signal for driving a second valve. The comparison circuit compares the first signal with the second signal and generates a warning signal if predetermined differences are detected between the first driving signal and the second driving signal.

17 Claims, 4 Drawing Sheets

(56) References Cited

U.S. PATENT DOCUMENTS

| | | | |
|---|---|---|---|
| 4,115,756 A | | 9/1978 | DiCecio |
| 5,038,092 A | * | 8/1991 | Asano .............. H02M 7/53875 |
| | | | 318/799 |
| 5,209,141 A | * | 5/1993 | Asayama ............ F16H 61/0206 |
| | | | 477/121 |
| 5,526,264 A | | 6/1996 | Niggemann et al. |
| 5,763,963 A | | 6/1998 | Zydek et al. |
| 6,401,491 B1 | * | 6/2002 | Wacke ................. C03B 9/3627 |
| | | | 264/40.3 |
| 2003/0111900 A1 | | 6/2003 | Inoue |
| 2004/0100150 A1 | * | 5/2004 | Bolz ............... H03K 17/08142 |
| | | | 307/116 |
| 2009/0299592 A1 | | 12/2009 | Oehler et al. |

\* cited by examiner

HOMOGENEITY DETECTION CIRCUIT, A VALVE DRIVING SYSTEM AND A METHOD OF HOMOGENEITY DETECTION IN A VALVE DRIVING SYSTEM

FIELD OF THE INVENTION

This invention relates to a homogeneity detection circuit for detecting an incorrect operation of components of a valve driving system and to an integrated circuit device comprising the homogeneity detection circuit. The invention further relates to a valve driving system and a vehicle comprising the valve driving system. The invention also relates to a method of homogeneity detection in a valve driving system and a computer program product to perform such a method.

BACKGROUND OF THE INVENTION

Valves and driving circuitries of valves in, for example, anti-lock braking systems (ABS) and Electronic stability program (ESP) systems of vehicles have to fulfill various safety conditions to prevent that a vehicle with such a system might have a defect ABS or ESP system. Some of these safety conditions must be tested on a regular basis, for example, after starting the vehicle and also when the vehicle is driving and the valves of the ABS or ESP system are not actively used. In many systems, the valve driving circuitry may operate in a test mode, which is, for example, activated when the vehicle is switched on and, thus, the ABS or ESP systems are switched on. In the test mode the valve driving circuitry may generate a signal which forces a small current through the mainly inductive load of the valve. The current is small enough to prevent that the valve is controlled in another position (e.g. from open to closed or from closed to open), but the current is large enough to measure parameters of the valve driving circuitry and/or of the valve. The measuring of the parameters is used to decide whether the valve driving circuitry is still operating according to its specification and/or to decide whether the valve still (electrically) operates according to its specifications.

U.S. Pat. No. 5,763,963 discloses a circuit arrangement for driving an inductive load (such as a valve) which comprises an additional measuring device for measuring a current through the inductive load. Parallel to the driving transistor a series arrangement of a transistor and an ohmic measuring resistor is provided and a voltage across the resistor is measured and analyzed to determine the status of the driving circuitry.

In the cited US patent every valve driving circuit must be provided with the additional transistor, resistor and circuit to measure and analyze the voltage across the resistor. When the circuit is being implemented in an integrated circuit, it results in a significant die size increase. When implemented with separate components, a relatively large amount of additional components must be used in the circuits. Therefore, the solution presented in the US patent is relatively expensive. Furthermore, the safety solution of the US patent is not able to detect specific problems in the valve driving system as whole. For example, the valve driving circuit, including the solution of the US patent, may be integrated on one integrated circuit and bonded wires may be used to conduct a current from the integrated circuit (silicon) towards a pin being connected to the valve. Often several bonded wires are used to allow relatively large driving currents. However, the solution of the US patent is not capable of detecting whether one of the bonded wires is not connected and thus, the US patent does not provide a solution for a possible safety risk when one of the bonded wires is not connected.

SUMMARY OF THE INVENTION

The present invention provides a homogeneity detection circuit, a valve driving system, a vehicle, an integrated circuit, a method of homogeneity detection in a valve driving system and a computer program product as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
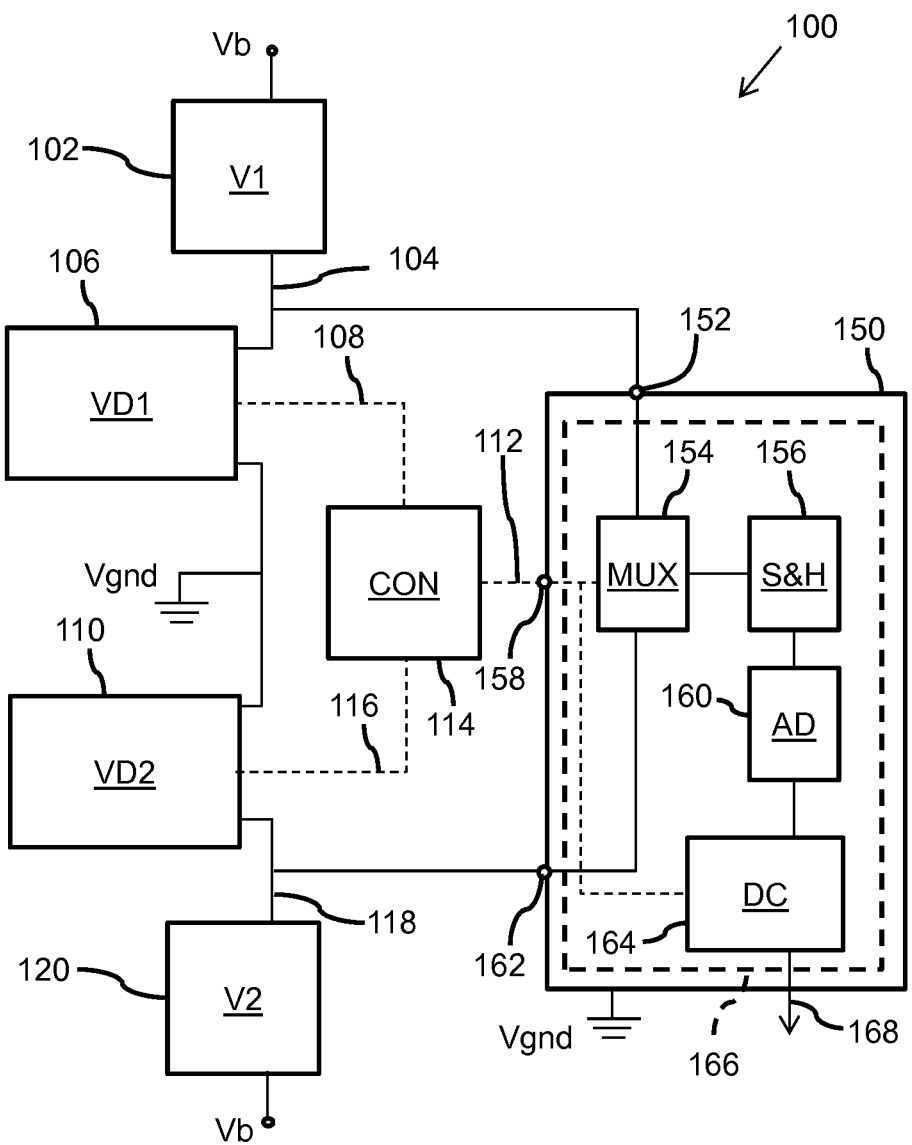
FIG. 1 schematically shows an example of an embodiment of a valve driving system comprising an embodiment of a homogeneity detection circuit, FIG. 2 schematically shows another example of a valve driving system comprising another embodiment of a homogeneity detection circuit, FIG. 3 schematically shows the sample and hold circuit of the embodiment of FIG. 2, and FIG. 4 schematically shows an example of a method according to the invention.

FIG. 1 schematically shows an example of an embodiment of a valve driving system 100 comprising an embodiment of a homogeneity detection circuit 150. The valve driving system 100 comprises two valves V1, V2, 102, 120 which are coupled between a battery voltage (e.g. the voltage of a battery of a vehicle) and a valve driving circuit VD1, VD2, 106, 110. The first valve V1, 102 receives from the first valve driving circuit VD1, 106 a first driving signal 104. The second valve V2, 120 receives from the second valve driving circuit VD2, 110 a second driving signal 118. Each valve driving circuit VD1, VD2, 106, 110 is also coupled to a ground voltage Vgnd.

In a specific embodiment, the valves V1, V2, 102, 120 are mainly an inductive load seen from the valve driving circuit VD1, VD2, 106, 110. In a specific embodiment of the valve driving circuits VD1, VD2, 106, 110, the valve driving circuits VD1, VD2, 106, 110 use pulse width modulation to obtain a relatively stable current through the valves V1, V2, 102, 120 when they are controlling the valves V1, V2, 102, 120, i.e. when they control whether the valves must be opened or must be closed. In a specific embodiment, the valve driving circuits VD1, VD2, 106, 110 may operate in different operational modes of which one is the controlling operational mode and one is the test mode. In the controlling operational mode the valve driving circuits VD1, VD2, 106, 110 may control the valve to which they are connected, in other words, they may provide a valve driving signal to the value such that the valve opens, or, in another embodiment, such that the valve closes. In the controlling operational mode the valve driving circuits VD1, VD2, 106, 110 may also be standby and are not generating the driving signals. Basically, seen in time, the valve driving circuits VD1, VD2, 106, 110 are in the controlling operational mode when they are not in the test mode. In the test mode the valve driving circuits VD1, VD2, 106, 110 generate a valve driving signal which does not change the state of the valve (i.e. does not open or does not close the valve) but which is large enough to measure parameters of the valve driving circuit VD1, VD2, 106, 110 itself and/or to measure parameters of the valve V1, V2, 102, 120. Especially in the test mode, deviations in the determined characteristics must be found in order to be sure that in normal operation, the valve driving circuit VD1, VD2, 106, 110 and/or the valve V1, V2, 102, 120 operate according to their specifications.

The valve driving system 100 may comprise a controller CON, 114 which controls the valve driver circuits VD1, VD2, 106, 110 such that they switch at required moments in time to the test mode and such that the switch to the operational mode at required moment in time. The controller CON, 114 may also have some additional functions such as providing a command to the valve driving circuits VD1, VD2, 106, 110 to close or to open the valve which they drive. Thus, when the valve driving circuits VD1, VD2, 106, 110 are in the controlling operational mode, and are standby, such a command may wake them up to start generating the driving signals. The controller CON, 114 provides a first control signal 108 to the first valve driving circuit VD1, 106 and provide a second control signal 116 to the second valve driving circuit VD2, 110. The controller CON, 114 may also be part of the vehicle computer system which controls the vehicle that comprises the valve driving system 100.

The valve driving system 100 comprises a homogeneity detection circuit 150 according to the first aspect of the invention. The homogeneity detection circuit 150 comprises a first input 152 at which a first signal is received which relates to a current or voltage of the first driving signal 104. In the shown configuration the first input 152 is directly coupled to the first driving signal 104, which allows the measurement of a voltage of a point of the electrical connection between the first valve driving circuit VD1, 106 and the first valve V1, 102 to which the first input 152 is coupled. If the first signal must relate to a current of the first driving signal 104, the first signal may be a voltage measured across a resistor which is placed in between the first valve driving circuit VD1, 106 and the first valve V1, 102. The homogeneity detection circuit 150 further comprises a second input 162 at which a second signal is received which relates to a current or a voltage of the second driving signal 118. In the presented configuration the second signal mainly relates to a voltage of a point of the electrical connection between the second valve driving circuit VD2, 110 and the second valve V2, 120 to which the second input 162 is coupled.

The homogeneity detection circuit 150 further comprises a comparison circuit 166. The comparison circuit compares the first signal with the second signal and generates a warming signal 168 if predetermined differences are detected between the first driving signal and the second driving signal. For example, in an analogue implementation of the comparison circuit 166 comprises at least a differential opamp for comparing the two signals. The comparison circuit 166 is an important element of the invention, because this circuit provides the possibilities to detect differences between the driving signals 104, 118 and if the differences are too large, it may imply that one of the valve driving circuits VD1, VD2, 106, 110 is defect or does not anymore operate according to its specification, or it may imply that one the valves V1, V1, 102, 120 is defect or does not anymore operate according to its specification, or it may imply that one of the electrical connections between the respective valve driving circuits VD1, VD2, 106, 110 and their corresponding valves V1, V2, 102, 120 is defect or is partially defect (has, for example, another ohmic value). Thus, if predetermined differences are detected, there might be something wrong in the valve driving system 100 and this is reported in the form of a warning signal 168. The warning signal 168 may be used to generate a warning for a driver of a vehicle which comprises the valve driving system 100 such that the driver may decide to warn the workshop and/or park the vehicle at a safe location such that a mechanic is able to check the valve driving system 100. Alternatively, the warning signal 168 may be used to store a note in a (data) storage means or a controller of the vehicle such that, when the vehicle returns to the workshop for maintenance, a mechanic may check the valve driving circuits VD1, VD2, 106, 110, may check the valves V1, V2, 102, 120 and may check the electrical connections between them. The homogeneity detection circuit 150 may comprise an output for providing the warning signal 168 indicating that predetermined differences are detected between the driving signals 104, 118 of two valves V1, V2, 102, 120. Thus, the homogeneity detection circuit 150 is capable of generating a warning signal 168 that warns for possible errors at many different locations in the complete valve driving system 100. This increases the safety of a vehicle which comprises the valve driving system 100. Furthermore, the homogeneity detection circuit 150 is capable of monitoring the operation of two valve driving circuits VD1, VD2, 106, 110 with their respective valves V1, V2, 102, 120 and no specific monitoring circuit must be provided for each combination of a valve driving circuit VD1, VD2, 106, 110 and its respective valve V1, V2, 102, 120.

When differences between the first driving signal 104 and the second driving signal 118 are large enough to generate the warming signal 168 strongly depends on the used valves V1, V2, 102, 120 and the used valve driving circuits VD1, VD2, 106, 110. For example, when the used valves V1, V2, 102, 120 and the used valve driving circuits VD1, VD2, 106, 110 are equal to each other, a difference may already be too large if the one of the first driving signal 104 and the second driving signal 118 deviates more than, for example, 20% from the other one of the first driving signal 104 and the second driving signal 118. In another example, if only smaller differences may be tolerated to be sure about a safe operation of the valve driving system 100, a difference may already be too large if the one of the first driving signal 104 and the second driving signal 118 deviates more than, for example, 10%, or, for example, 5% from the other one of the first driving signal 104 and the second driving signal 118. If the valves V1, V2, 102, 120 and valve driving circuits VD1, VD2, 106, 110 are not equal, and, for example, the second valve V2 requires a twice as powerful second driving signal 118 compared to the first driving signal 104, a difference is too large if a multiplication of the first driving signal 104 by two deviates more than 20% from the second driving signal, or if a multiplication of the first driving signal 104 by two deviates more than, for example, 10%, or, for example, 5% from the second driving signal. In other words, it must be predetermined when a warning signal 168 must be generated, and it must be predetermined how the first driving signal 104 and second driving signal 118 have to relate to each other to omit the generation of the warning signal 18 and how the first driving signal 104 and second driving signal 118 have to relate to each other to generate of the warning signal 168.

In a specific embodiment of the homogeneity detection circuit 150, the comparison circuit 166 only uses the first signal when the first valve V1, 102 receives the first driving signal 104 in a test mode of the first valve driving circuit VD1, 106, and the comparison circuit 166 only uses the second signal when the second valve V2, 120 receives the second driving signal 118 in a test mode of the second valve driving circuit VD2, 110. It implies that the comparison circuit 166 is capable of temporarily storing the information of the first signal and/or the second signal until the other signal becomes available. Therefore, no specific changes must be made to the test cycles of the different components of the valve driving system 100 and the homogeneity detection circuit does not influence the normal driving of the valves V1, V2, 102, 120. The homogeneity detection circuit 150 may comprise a third input 158 at which a control signal 112 is being received from the controller CON, 114 and the control signal 112 indicates when the first valve V1, 102 and/or the second valve V2, 120 receive their respective driving signal in the test mode.

Optionally, the comparison circuit 166 may comprise a multiplexing circuit MUX, 154 which multiplexes the first signal and the second signal into a multiplexed signal. For example, on basis of information in the control signal 112, the multiplexing circuit MUX, 154 may provide the value of first signal in the multiplexed signal or provide the value of the second signal in the multiplexed signal. In another embodiment, the multiplexing circuit MUX, 154 samples the first signal and the second signal in an alternating order at predefined moments in time and generates a multiplexed signal which comprises at the intervals in between the sample moments, the sampled value of the first signal or of the second signal. In an alternative embodiment, the multiplexing circuit MUX, 154 is a switch which couples the output of the multiplexing circuit for predefined periods of time alternatingly to the first input 152 and to the second input 162. When such a multiplexing circuit MUX, 154 is being present in the comparison circuit 166, the comparison circuit 166 analyses a in time multiplexed way the multiplexed signal to detect predetermined differences between the first driving signal 104 and the second driving signal 118. This means that the comparison circuit is able to relate the multiplexed signal to the first signal at other moments in time than when it relates the multiplexed signal to the second signal. Therefore, when the multiplexing is performed on basis of the information of the control signal 112, the comparison circuit may also use the information of the control signal 112 being received at the third input.

As shown in FIG. 1, the comparison circuit 166 may also comprise a sample and hold circuit S&H, 156, an analogue-digital converter AD, 160 and a digital comparison circuit DC, 164. The sample and hold circuit S&H, 156 receives the multiplexed signal and samples the multiplexed signal at specific moments in time and holds the sampled multiplexed signal for predetermined periods of time. The sample and hold circuit S&H, 156 generates a sample and hold signal which is equal to the held sampled multiplexed signal. The analogue-digital converter AD, 160 converts the sample and hold signal into a digital signal. For example, the analogue-digital converter AD, 160 samples, with a certain frequency, the sample and hold signal and the sampled values are converted to digital values which are provided in the digital signal and the digital signal may comprise a train of digital values representing the value of the sample and hold signal.

It is to be noted that the digital signal may be transported via a single wire in a serial manner, or may be transported via a bundle of parallel wires which each transport one bit of the digital numbers. The digital comparison circuit DC, 164 receives the digital signal and compares the digital signal at a moment in time when the digital signal relates to the first signal with the digital signal at another moment in time when the digital signal relates to the second signal. Thereby, the digital comparison circuit DC, 164 is able to detect predetermined differences between the first driving signal and the second driving signal, and, when predetermined differences are detected, the warming signal 168 is generated. The digital comparison circuit DC, 164 may also receive the control signal 112 such that it is able to determine at which moments in time the digital signal relates to the first signal and at which moments in time the digital signal relates to the second signal. The digital comparison circuit DC, 164 may comprise a (data) storage means for temporarily storing one or more values of the digital signal such that it may compare the stored value(s) at a later moment in time with the actual value of the digital signal such that the predetermined differences may be detected. It is to be noted that the digital comparison circuit DC, 164 may be implemented in a processor which comprises data storages means and which runs under the influence of a computer program product which comprises instructions causing the processor to perform the task of the digital comparison circuit. In another embodiment, the digital comparison circuit DC, 164 is manufactured of dedicated hardware components such that the digital comparison circuit DC, 164 is able to perform the tasks as discussed previously.

It is to be noted that the sequence of the multiplexing circuit MUX 154, the sample and hold circuit 156, the analogue-digital converter AD, 160 and the digital comparison circuit DC, 164 may operate in a synchronous way, which means in practical embodiments, that the multiplexing, the sampling, the holding, the conversion to a digital signal and the comparing are actions which relate to each other and the timing of the different actions need to be adjusted to each other. It does not necessary mean that the timing must be performed according to a fixed frequency. In practical embodiments, the information of the control signal 112 may be the basis for controlling and timing the multiplexing, the sampling, the holding, the conversion to the digital signal and the comparing.

The invention also relates to a vehicle (not shown) which comprises the presented valve driving system 100 or which comprises the valve driving systems of subsequently presented embodiments. The valves driving system 100 may, for example, be used in anti-lock braking systems (ABS) and Electronic stability program (ESP) systems of vehicles. The invention further relates to an integrated circuit which comprises the discussed homogeneity detection circuit 150 or the discussed homogeneity detection circuit of subsequent embodiments.

Figure 2:
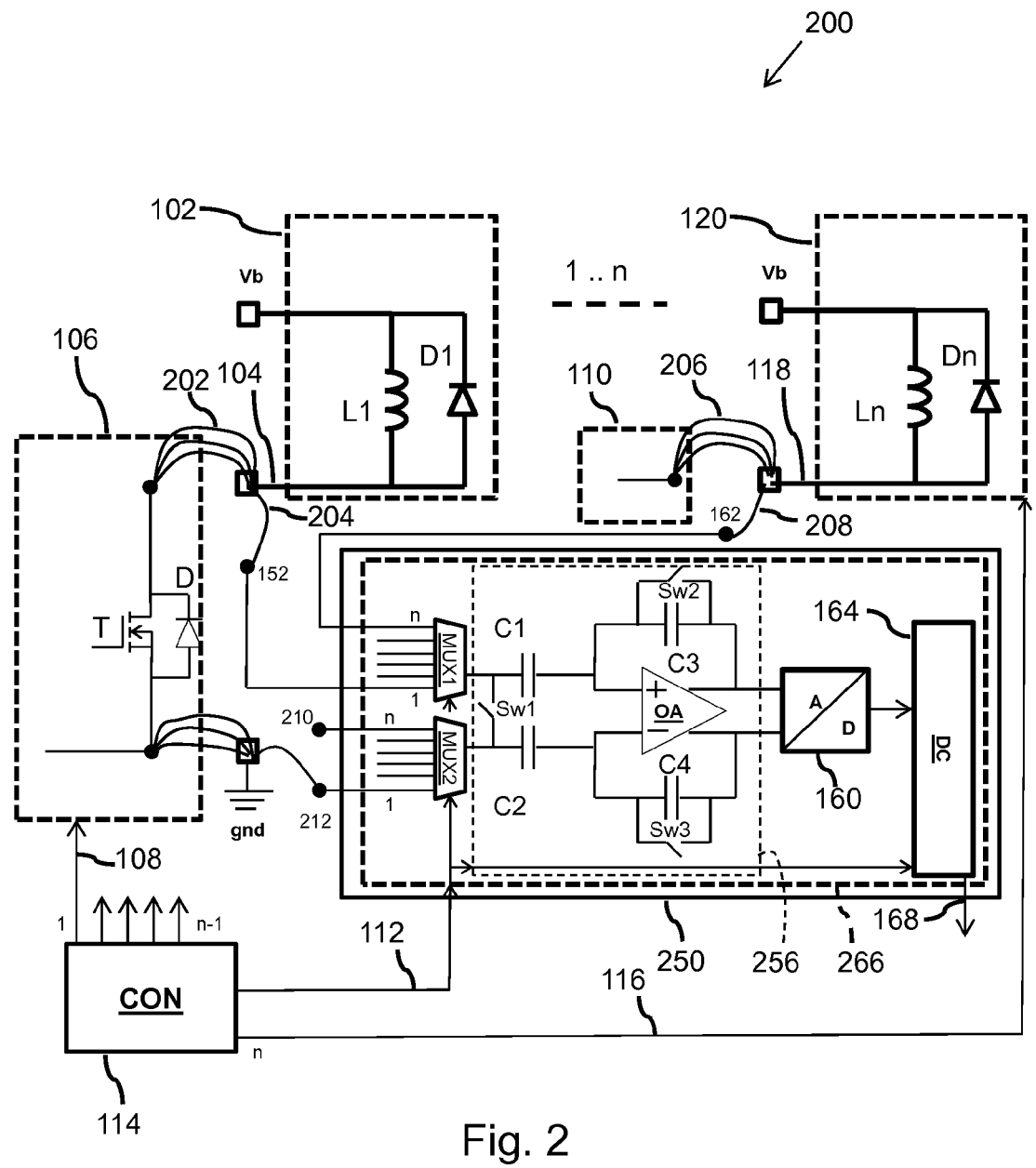

FIG. 2 schematically shows another example of a valve driving system 200 comprising another embodiment of a homogeneity detection circuit 250. In the example of FIG. 2, a plurality of n valves 102, 120 are schematically drawn and each one of the n valves 102, 120 is coupled to a respective of a plurality of n valve driving circuit 106, 110. Each valve 102, 120 comprises a primary inductive load L1, Ln which is coupled between a battery voltage Vb (e.g. a power supply voltage) and an output of the respective valve driving circuit 106, 110. Typically, a diode D1, Dn is provided parallel to the inductive load L1, Ln to allow a recirculation of a current through the inductive load L1, Ln when the valve driving circuit 106, 110 does not provide a current.

Typical examples of valve driving circuits 106, 110 that drive a valve, which forms a primary inductive load L1, Ln, are valve driving circuits 106, 110 which use pulse width modulation to control a current through the inductive load L1, Ln. In the prior art several of such valve driving circuit may be found, see, for example, in the cited US patent U.S. Pat. No. 5,763,963. Typically, such valve driving circuits 106 110 comprise a MOSFET T which operates as a controllable switch for controlling the driving signal 104, 118. Typically, a diode D is coupled parallel to the MOSFET T. The current of the driving signal 104, 118 reaches often relatively high level, in the order of some amperes. Especially when the valve driving circuit 106, 120 is manufactured on an integrated circuit, for example, manufactured in Silicon, the connection between the integrated circuit and a pin of the housing of the integrated circuit is made by bonded wires 202, 206. For example, for each ampere at least one bonded wire is used. Consequently, the integrated circuit needs also to be coupled with bonded wires to a pin which is to be connected to the ground voltage gnd. Especially when one of the bonded wires 202, 206 is broken, the resistance of the current conduction path through which the respective driving signal flows increases, which may result in an incorrect driving of the valves 102, 120. The invention is also capable of detection such changes, because the homogeneity detection circuit 250 is coupled to points of the current conduction paths through which the driving signals flow. If one of the bonded wires 202, 206 is broken, the voltage of this point is different and/or the current flowing through the current conduction path differs too much with respect to other measured voltages or currents of other current conduction paths (belonging to the other valve driving circuits and other valves). Consequently, predetermined differences can be detected and, thus, the warning signal 168 is generated.

As discussed in the context of FIG. 1, the valve driving circuits 106, 110 are capable of operating in an operational mode and in a test mode. In the test mode the valve driving circuits 106, 110 provide a signal to their respective valves 102, 120 which results in the flow of a small current through the inductive loads L1, Ln, for example, a current of 100 mA. In the test mode, the valves 102, 120 are not operated such that if they are open, that they close, or if they are closed, that they open. In the operational mode of the valve driving circuits 106, 110, the valve driving circuit 106, 110 may provide a signal to their respective valves 102, 120 which results in the opening or closing of the valves.

The valve driving system 200 also comprises a controller CON, 114 which is similar to the controller CON, 114 of FIG. 1. The controller provides to each valve driving circuit 106, 120 a valve driving circuit control signals 108, 116, which, at least, controls the valve driving circuits 106, 120 in the test mode or in the operational mode. The valve driving circuit control signals 108, 116 may also provide information to the valve driving circuits 106, 110 about when they have to generate a valve driving signal 104, 118 which opens or closes their respective valves 102, 120 (while the valve driving circuits 106, 110 are in the operational mode). The controller CON, 112 also generates a control signal 112 for the homogeneity detection circuit 250. The control signal 112 at least indicates when which valve driving circuit 106, 110 is in the test mode and, thus, provides a test valve driving signal to their respective valves 102, 120.

The homogeneity detection circuit 250 comprises a plurality of ground voltage input nodes 210, 212 which are coupled to a ground voltage pin of the respective valve driving circuit 106, 110. The homogeneity detection circuit 250 also comprises a plurality of inputs 152, 162 which receive a signal that relates to a voltage (or a current) of a specific driving signal 104, 118 of a respective valve 102, 120. As shown in FIG. 2, input 152 is coupled with a bonded wire to an output pin of the valve driving circuit 106 and input 162 is coupled with a bonded wire to an output pin of the valve driving circuit 110.

The homogeneity circuit 250 comprises a comparison circuit 266 which comprises a first multiplexing circuit MUX1 and a second multiplexing circuit MUX2. The first multiplexing circuit MUX1 receives a plurality of signals from the plurality of inputs 152, 162 at which a voltage is received which relates to respective valve driving signals 104, 118. The second multiplexing circuit MUX2 is coupled to the plurality of ground voltage input nodes 210, 212. The multiplexing circuits MUX1, MUX2 multiplex the received input signals into a multiplexing signal that is being provided to a sample and hold circuit 256. If the first multiplexing circuit MUX1 provides the signal related to the first driving signal 104 to the multiplexed signal, the second multiplexing circuit MUX2 couples the ground voltage of the first valve driving circuit 106 also to the multiplexed signal. If the first multiplexing circuit MUX1 provides the signal related to the second driving signal 118 to the multiplexed signal, the second multiplexing circuit MUX2 couples the ground voltage of the second valve driving circuit 1110 also to the multiplexed signal. Thus, the first multiplexing circuit MUX1 and the second multiplexing circuit MUX2 operate in a synchronous manner, which means that they couple, at the same moment in time, the multiplexed signal to the two inputs which relate to one of the valve driving circuits 106, 110. The operation of the two multiplexing circuit MUX1, MUX2 is related to the control signal 112 which is received from the controller CON, 114. If the control signal 112 indicates that, for example, the first valve driving circuit 106 is in the test operational mode, the two multiplexing circuits MUX1, MUX2 couple the multiplexing signal to the inputs of the multiplexing circuit MUX1, MUX2 which are coupled to the pins of the first valve driving circuit 106.

The comparison circuit 266 also comprises a specific sample and hold circuit 256 which receives the multiplexed signal and generates a sample and hold signal that is being provided to the analogue-digital converter 160. The details and operation of the sample and hold circuit 256 are discussed in the context of FIG. 3.

The comparison circuit 266 further comprises an analogue-digital converter 160 which receives the sample and hold signal and generates a digital signal. The comparison circuit 266 also comprises a digital comparison circuit DC, 164 which receives the digital signal 168. Embodiments and characteristics of the analogue-digital converter 160 and the digital comparison circuit DC, 164 are discussed in the context of FIG. 1. In a further embodiment of the digital comparison circuit DC, 164, the digital comparison circuit DC, 164 does not only generate a warning signal 168 which indicates that predetermined differences are detected between the driving signals 104, 118 of the different valves 102, 120, but the digital comparison circuit DC, 164 generates the warning signal 168 which indicates which one of the driving signals 104, 118 of which one of the different valves 102, 120 is different from the other driving signals 104, 118. For example, the digital comparison circuit DC, 164 generates in its internal memory a table with values related to the different driving signals 104, 118 and checks which values differ more than a predetermined difference from the other values such that it is clear which driving signal 104, 118 deviates too much from the other driving signal 104, 118.

Figure 3:
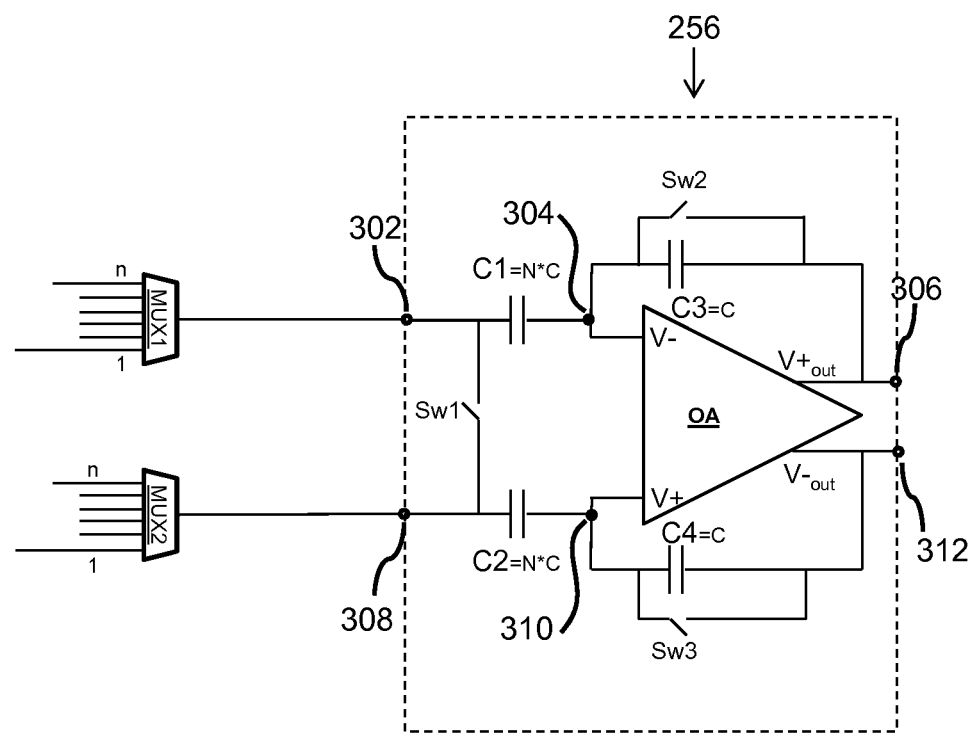

FIG. 3 schematically shows the sample and hold circuit 250 of the embodiment of FIG. 2. The sample and hold circuit 256 has a first input node 302, a second input node 308, a first terminal 304, a second terminal 310, a first output node 306 and a second output node 312. In between the first input node 302 and the second input node 308 is coupled a first controllable switch Sw1. In between the first input node 302 and the first terminal 304 is coupled a first capacitor C1 which has a capacitance of N times C. In between the second input node 308 and the second terminal 310 is coupled a second capacitor C2 which has a capacitance of N times C. The sample and hold circuit 250 comprises an differential opamp OA which has a V+ input node and a V− input node and which has a first output node V+$_{out}$ and a second output node V−$_{out}$. The V+ input node of the differential opamp OA is coupled to the first terminal 304. The V− input node of the differential opamp OA is coupled to the second terminal 310. The first output node V+$_{out}$ of the differential opamp OA is coupled to the first output node 306 and the second output node V−$_{out}$ of the differential opamp OA is coupled to the second output node 312. A second controllable switch Sw2 is coupled in between the first terminal 304 and the first output node 306 and a third capacitor C3 is arranged parallel to the second controllable switch Sw2. The third capacitor C3 has a capacitance C. A third controllable switch Sw3 is coupled in between the second terminal 310 and the second output node 312 and a fourth capacitor Cc is arranged parallel to the third controllable switch Sw3. The fourth capacitor C4 has a capacitance C. The differential opamp OA operates according to the formula: $(V−_{out}−V+_{out})=A*(V+−V−)$. Wherein, V−$_{out}$ is the voltage of the second output node of the differential opamp OA, V+$_{out}$ is the voltage of the first output node of the differential opamp OA, V+ is the voltage of the V+ input node of the differential opamp OA, V− is the voltage of the V− input node of the differential opamp OA and A is the amplification factor of the differential opamp OA.

The operation of the sample and hold circuit 256 is explained together with the operation of the multiplexing circuits MUX1, MUX2. As discussed previously, the multiplexing circuits MUX1, MUX2 have n inputs and couple one of the inputs to their output to obtain the multiplexed signal. In the specific example of FIG. 3, the multiplexing circuits MUX1, MUX2 are arranged to simultaneously multiplex an input which is coupled to one specific valve driving signal and a ground voltage of the respective valve driving circuit that generates this specific valve driving signal. Thus, in the following paragraphs, if it has been mentioned that the multiplexing circuits MUX1, MUX2 couple the sample and hold circuit 256 to the n$^{th}$ valve driving signal, MUX1 couples its n$^{th}$ input to its output and MUX2 couples its n$^{th}$ input to its output. Subsequently, the first input node 302 of the sample and hold circuit 256 receives the n$^{th}$ signal which relates to a current or a voltage of the n$^{th}$ valve driving signal, and the second input node 308 receives the ground voltage which is present at an input of the n$^{th}$ valve driving signal driving the n$^{th}$ valve.

The operation of the sample and hold circuit comprises a first step of "MUX selection". This means that the multiplexing circuits MUX1, MUX2 couple the multiplexed signal to a specific one of the valve driving signals. Thus, the multiplexed signal relates to the specific one of the valve driving signals. In a subsequent step, which is termed the "sample" step, the first controllable switch Sw1 is open (in a non-conducting mode) and the second and third controllable switches Sw2, Sw3 are closed (in a conducting mode). In this configuration, the differential amplifier OA is in an unitary gain configuration and the output voltages of the output nodes V+$_{out}$ and V−$_{out}$ of the differential amplifier OA are equal to the input voltages of the input nodes V− and V+ of the differential amplifier OA. The output voltages are regulated internally in the differential amplifier OA to a common mode voltage V$_{cm}$. No charge is being stored in the third and the fourth capacitor C3, C4. The charge stored in the first capacitor C1 is equal to $N*C*(V_{first\ input\ node\ 302}−V_{cm})$, wherein N is a capacitor multiplication factor. As discussed above, the capacitance of the first capacitor C1 has the value of N*C, wherein C is the capacitance of the third and fourth capacitor C3, C4. The charge stored in the second capacitor C2 is equal to $N*C*(V_{second\ input\ node\ 308}−V_{cm})$. In a third step "charge transfer", the multiplexing circuits disconnect the multiplexing signal from the valve driving signal and the first controllable switch SW1 is closed (arranged in a conducting mode). The second and third controllable switches are opened (arranged in a non-conducting mode). Subsequently, the voltage of the first input node 302 and the second input node 308 become equal to each other ($V_e=V_{first\ input\ node\ 302}=V_{second\ input\ node\ 308}$). This results in a stored charge in the first capacitor C1 which is equal to $N*C*(V_c−V_{terminal\ 304})$ and a stored charge in the second capacitor which is equal to $N*C*(V_c−V_{terminal\ 310})$. The difference of the charge between the previous step and this step is transferred, respectively, to the third capacitor C3 and the fourth capacitor C4. The difference charge stored in the third capacitor C3 is $DeltaQ1=N*C*(V_e−V_{terminal\ 304})−N*C*(V_{first\ input\ node\ 302}−V_{cm})$ and the charge stored in the fourth capacitor C4 is $DeltaQ2=N*C*(V_e−V_{terminal\ 310})−N*C*(V_{second\ input\ node\ 308}−V_{cm})$. For an ideal differential amplifier OA, the voltage of the first terminal 304 and the voltage of the second terminal 310 are $V_{terminal\ 304}=V_{terminal\ 310}=V_{in}$. Subsequently, a voltage across the third capacitor C3 may be expressed by a first equation: $V_{C3}=V_{in}−V_{first\ output\ node\ 306}=DeltaQ1/C$ and a voltage across the fourth capacitor C4 may be expressed by a second equation $V_{C4}=V_{in}−V_{secondoutput\ node\ 312}=DeltaQ2/C$. The first and second equation can be used to calculate the voltage across the output nodes 306, 312 of the sample and hold circuit, which is: $(V_{first\ output\ node\ 306}−V_{second\ output\ node\ 312})=N*(V_{first\ input\ node\ 302}−V_{second\ input\ node\ 308})$. Thus, the sample and hold circuit 256 provide an output voltage across its output nodes which has a linear relation with the input voltage across its input nodes and the linear relation is formed by the multiplication factor N. The sample and hold circuit 256 may remain for some time in the third step of "charge transfer", which means that the output voltage at the output nodes 306, 312 remains for a predefined interval of time at the value which is calculated above. During this time interval the analogue-digital converter needs to sample at least one time the analogue voltage across the output nodes 306, 312 of the sample and hold circuit. Thus, the third step has also the function of "holding" the value which was received at the input. The digital value being present in the digital value is used by the digital comparison circuit to compare the operation of different valve driving circuits and their respective valves with each other. After the predetermined interval of time, the operation of the sample and hold circuit returns to the first step, as discussed above, with the only difference that the multiplexing circuits MUX1, MUX2 couple the multiplexing signal to a subsequent valve driving signal.

It is to be noted that FIG. 3 provides an example of a sample and hold circuit 256. Other suitable sample and hold circuits may be used as well.

Figure 4:
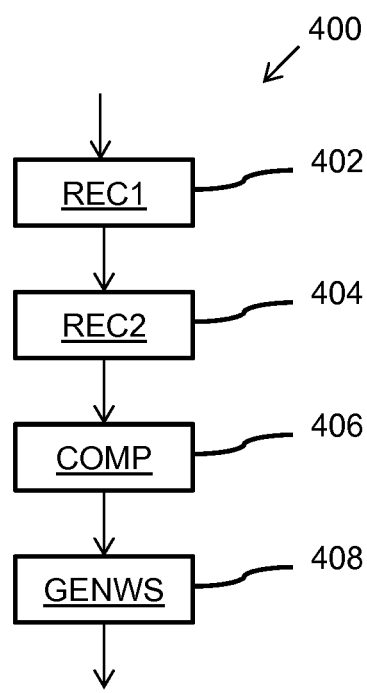

FIG. 4 shows an example of a method 400 of homogeneity detection in a valve driving system. The valve driving system comprises at least a first valve and a second valve and comprises at least a first valve driving circuit and a second valve driving circuit. The first valve driving circuit provides a first valve driving signal to the first valve and the second valve driving circuit provides a second valve driving signal to the second valve. The method 400 comprises the stages of: i) receiving REC1, 402 a first signal relating to a voltage or a current of the first valve driving signal, ii) receiving REC2, 404 a second signal relating to a voltage or a current of the second valve driving signal, iii) comparing COMP, 406 the received first signal with the received second signal to detect predetermined differences between the received first signal and the received second signal, and iv) generating GENWS, 408 a warning signal if predetermined differences are detected. The method according to the invention provides the same benefits as the homogeneity detection circuit and the valve driving system according to previously discussed embodiments of the invention and has similar embodiments with similar effects as the corresponding embodiments of the circuit and/or system.

According to another aspect of the invention, a computer program product is provided which comprises instructions for causing a processor system to perform the above discussed method of the invention.

Summarized, the current invention provides a homogeneity detection circuit, a valve driving system, a vehicle, an integrated circuit and a method of homogeneity detection in a valve driving system. The homogeneity detection circuit comprises a first input, a second input and a comparison circuit. The first input receives a first signal being related to a first driving signal for driving a first valve. The second input receives a second signal being related to a second driving signal for driving a second valve. The comparison circuit compares the first signal with the second signal and generates a warning signal if predetermined differences are detected between the first driving signal and the second driving signal.

The invention may also partly be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

A computer system or processor system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above.

Each digital signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals. Each analogue signal described herein may comprise information in the form of a voltage or in the form of a current.

The signal conductors, current conductors or electrical connections as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A homogeneity detection circuit for detecting an incorrect operation of components of a valve driving system, the homogeneity detection circuit comprising:
   a first input for receiving a first signal being related to a voltage or a current of a first driving signal for driving a first valve;
   a second input for receiving a second signal being related to a voltage or a current of a second driving signal for driving a second valve;
   a comparison circuit for comparing the first signal with the second signal and for generating a warning signal if predetermined differences are detected between the first driving signal and the second driving signal, wherein the comparison circuit is configured to use only the first signal when the first valve receives the first driving signal in a test mode and to use only the second signal when the second valve receives the second driving signal in the test mode; and
   a third input for receiving, from a controller, a control signal indicating when the first valve and/or the second valve receive respective driving signals in the test mode.

2. The homogeneity detection circuit according to claim 1, wherein the comparison circuit comprises a multiplexing circuit for multiplexing the first signal and the second signal into a multiplexed signal, and wherein the comparison circuit is configured to analyze in a time multiplexed way the multiplexed signal to detect predetermined differences between the first driving signal and the second signal.

3. The homogeneity circuit according to claim 2, wherein the multiplexing circuit is configured for using the control signal received at the third input to multiplex the first signal and the second signal into the multiplexed signal.

4. The homogeneity detection circuit according to claim 2, wherein the comparison circuit further comprises:
   a sample and hold circuit for sampling the multiplexed signal and holding its value for a predetermined period of time for providing a sample and hold signal;
   an analogue-digital converter for converting the sample and hold signal to a digital signal;
   a digital comparison circuit for comparing the digital signal at a moment in time when the digital signal relates to the first signal with the digital signal at another moment in time when the digital signal relates to the second signal for generating the warning signal if the predetermined differences are detected between the first driving signal and the second driving signal.

5. The homogeneity detection circuit according to claim 4, wherein the sample and hold circuit is further configured to provide the sample and hold signal which is an amplified sample and hold signal, wherein the amplified sample and hold signal comprises amplified sampled multiplexing signal values for predetermined periods of time.

6. The homogeneity detection circuit according to claim 4, wherein the digital comparison circuit is configured for using the control signal received at the third input to determine when the digital signal relates to the first driving signal and when the digital signal relates to the second driving signal.

7. A homogeneity detection circuit according to claim 1, the homogeneity detection circuit comprises more than two inputs for receiving a signal being related to a voltage or a current of a specific driving signal for a specific valve, wherein the comparison circuit is configured for comparing the received signals for generating the warning signal if predetermined differences are detected between the received signals.

8. A homogeneity detection circuit according to claim 7, wherein the comparison circuit is configured for generating the warning signal such that the warning signal indicates which one of the received signals at one of the inputs differs more than the predetermined differences from the other received signals.

9. A valve driving system comprising:
a first valve being driven by an electric first driving signal;
a second valve being driven by an electric second driving signal;
a first valve driving circuit for driving the first valve,
a second valve driving circuit for driving the second valve;
a controller for controlling the first valve driving circuit and the second valve driving circuit; and
a homogeneity detection circuit including:
a first input for receiving a first signal being related to a voltage or a current of a first driving signal for driving a first valve;
a second input for receiving a second signal being related to a voltage or a current of a second driving signal for driving a second valve;
a comparison circuit for comparing the first signal with the second signal and for generating a warning signal if predetermined differences are detected between the first driving signal and the second driving signal, wherein the comparison circuit is configured to use only the first signal when the first valve receives the first driving signal in a test mode and to use only the second signal when the second valve receives the second driving signal in the test mode; and
a third input for receiving, from a controller, a control signal indicating when the first valve and/or the second valve receive respective driving signals in the test mode.

10. A valve driving system according to claim 9, wherein the first valve driving circuit and the second valve driving circuit are configured to operate in the test mode and in operational mode, wherein, in the operational mode, the respective valve driving circuits generate the respective electric driving signals to control the opening or closing of the respective valves and, in the test mode, the respective valve driving circuits generate the respective electric driving signals in a such way that an electrical operation of the respective driving circuit and the respective valve are tested without controlling the opening or closing the valves;
the controller is configured to control the respective valve driving circuits in the operational mode or in the test mode;
the homogeneity detection circuit is configured to generate a warning signal if predetermined differences are detected between the electric first driving signal of the first valve driving circuit operating in the test mode and the electric second driving signal of the second valve driving circuit operating in the test mode.

11. A valve driving system according to claim 10, wherein the controller is further configured to provide a control signal to the homogeneity detection circuit indicating when the first valve and/or the second valve receive the electric driving signals in the test mode.

12. A valve driving system according to claim 9, wherein first valve and the second valve are a substantially inductive load.

13. A valve driving system according to claim 9, wherein the first valve driving circuit and the second valve driving circuit are configured to control a current through the inductive load of the respective valves by means of pulse width modulated driving signals.

14. The valve driving system according to claim 9, wherein the valve driving system is implemented in a vehicle.

15. The valve driving system according to claim 9, wherein the homogeneity detection circuit in implemented in an integrated circuit device.

16. A method of homogeneity detection in a valve driving system, the valve driving system comprises at least a first valve and a second valve, at least a first valve driving circuit for providing a valve driving signal to the first valve and a second valve driving circuit for providing a valve driving signal to the second valve, the method comprising:
receiving a first signal relating to a voltage or a current of the first valve driving signal;
receiving a second signal relating to a voltage or a current of the second valve driving signal;
comparing the received first signal with the received second signal to detect predetermined differences between the received first signal with the received second signal;
generating a warning signal if predetermined differences are detected;
in an operational mode, respective first and second valve driving circuits generating respective ones of the first and second valve driving signals to control the opening or closing of respective ones of the first and second valves and, in a test mode, the respective one of the first and second valve driving circuits generating the respective ones of the first and second valve driving signals in a such way that an electrical operation of the respective one of the first and second driving circuit and the respective one of the first and second valve are tested without controlling the opening or closing the first and second valves.

17. The method of claim 16 wherein:
the first and second valves are a substantially inductive load.

* * * * *